United States Patent
Peng et al.

(10) Patent No.: US 9,923,119 B2
(45) Date of Patent: Mar. 20, 2018

(54) WHITE LED CHIP AND WHITE LED PACKAGING DEVICE

(71) Applicant: OPTO TECH CORPORATION, Hsinchu (TW)

(72) Inventors: Lung-Han Peng, Taipei (TW); Yao-Te Wang, Taipei (TW); Po-Chun Yeh, Taichung (TW); Po-Ting Lee, New Taipei (TW)

(73) Assignee: OPTO TECH CORPORATION, Hsinchu (TW)

( * ) Notice: Subject to any disclaimer, the term of this patent is extended or adjusted under 35 U.S.C. 154(b) by 139 days.

(21) Appl. No.: 14/489,639

(22) Filed: Sep. 18, 2014

(65) Prior Publication Data
US 2015/0091019 A1    Apr. 2, 2015

Related U.S. Application Data (63) Continuation-in-part of application No. 14/146,097, filed on Jan. 2, 2014, now Pat. No. 8,981,373.

(30) Foreign Application Priority Data

Oct. 1, 2013   (TW) .............................. 102135523 A (51) Int. Cl.
*H01L 33/00*    (2010.01)
*H01L 33/34*    (2010.01)
(Continued)

(52) U.S. Cl.
CPC .............. *H01L 33/34* (2013.01); *H01L 33/06* (2013.01); *H01L 33/26* (2013.01); *H01L 33/32* (2013.01); *H01L 33/16* (2013.01); *H01L 33/58* (2013.01)

(58) Field of Classification Search
CPC . H01L 25/0753; H01L 33/505; H01L 33/507; H01L 33/20; H01L 2924/12044;
(Continued)

(56) References Cited

U.S. PATENT DOCUMENTS

2006/0081873 A1    4/2006  Osinsky et al.
2006/0145170 A1    7/2006  Cho
(Continued)

FOREIGN PATENT DOCUMENTS

| TW | 201103163 | 1/2011 |
|----|-----------|--------|
| TW | 201230388 | 7/2012 |
| TW | 201308659 | 2/2013 |
| TW | 201324858 | 6/2013 |

OTHER PUBLICATIONS

Sheu et al., "White-light emission from InGaN—GaN multiquantum-well light emitting diodes with Si and Zn codped actie well layer", IEEE Photon. Tech. Letts, vol. 14, No. 4, p. 450-452, Apr. 2002.*

(Continued)

*Primary Examiner* — Meiya Li
(74) *Attorney, Agent, or Firm* — WPAT, PC (57) ABSTRACT

A white LED chip includes a P-type layer, a tunneling structure, an N-type layer, an N-type electrode, and a P-type electrode. The tunneling structure is disposed over the P-type layer. The tunneling structure includes a first barrier layer, an active layer and a second barrier layer. The first barrier layer includes a first material layer, the active layer includes a second material layer, and the second barrier layer includes a third material layer. The N-type layer is disposed over the tunneling structure. An energy gap of the second material layer is lower than an energy gap of the first material layer and an energy gap of the third material layer. Each of the first material layer, the second material layer and (Continued)

the third material layer is a metal oxide layer, a metal nitride layer or a metal oxynitride layer.

16 Claims, 4 Drawing Sheets

(51) Int. Cl.
   *H01L 33/32*    (2010.01)
   *H01L 33/06*    (2010.01)
   *H01L 33/26*    (2010.01)
   *H01L 33/58*    (2010.01)
   *H01L 33/16*    (2010.01)

(58) Field of Classification Search
   CPC ... H01L 2224/45139; H01L 2924/3025; H01L 2224/73265; H01L 2933/0041; H01L 2224/48091; H01L 2924/00; H01L 33/06; H01L 33/16; H01L 33/26; H01L 33/32; H01L 33/34; H01L 33/58
   See application file for complete search history.

(56) References Cited

U.S. PATENT DOCUMENTS

| 2011/0260191 A1* | 10/2011 | Kim | B82Y 30/00 257/98 |
| 2011/0294240 A1* | 12/2011 | Kim | H01L 25/0753 438/16 |
| 2013/0056785 A1* | 3/2013 | Hwang | H01L 27/15 257/99 |

OTHER PUBLICATIONS

N. Jiang, "Reactive sputtering deposition and characterization of zinc and oxy-nitride films for electronic and photovoltaic applications", Dissertation, The University of Toledo, May 2013.*

S. E. Aleksandrov et al., "Photoelectric properties of isotype and anisotype Si/GaN:O heterojunctions", Semiconductors, vol. 34, No. 11, 2000, pp. 1295-1300.*

Taiwan Patent Office, "Office Action," dated Jul. 8, 2015.

Taiwan Patent Office "Office Action" dated Jul. 22, 2016, Taiwan.

* cited by examiner

WHITE LED CHIP AND WHITE LED PACKAGING DEVICE

This application is a continuation-in-part application of U.S. patent application Ser. No. 14/146,097, field Jan. 2, 2014, which claims the benefit of Taiwan Patent Application Serial no. 102135523, filed on Oct. 1, 2013, the contents of which are incorporated herein by reference.

FIELD OF THE INVENTION

The present invention relates to a white LED chip and a white LED packing device, and more particularly to a white LED chip including a tunneling structure formed by metal oxide layers, metal nitride layers and/or metal oxynitride layers and a white LED packing device.

BACKGROUND OF THE INVENTION

Recently, white light emitting diodes (referred to as white LED) are introduced into the market. Since the white LED has the power-saving benefits, the white LED will gradually replace the conventional fluorescent tube.

Generally, the current white LED uses a phosphor to mix yellow light with blue light to produce white light. For example, when the blue light with a peak wavelength in the range between 450 and 470 nm is absorbed by a yellow phosphor $Ce:Y_3Al_2O_{12}$, a light with a peak wavelength in the range between 550 and 560 nm and a radiation wavelength in the range between 450 and 700 nm is generated. Consequently, the blue light and the yellow light are mixed to produce the white light.

Figure 1:
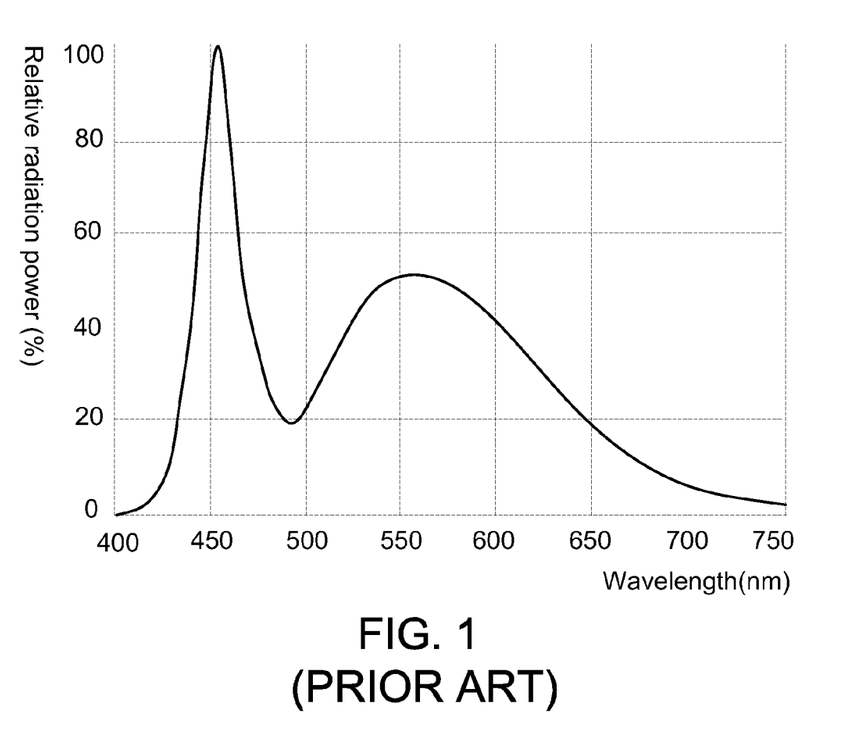
FIG. 1 (prior art) schematically illustrates the spectrum of a white LED that is produced by a conventional blue LED and a $Ce:Y_3Al_2O_{12}$ phosphor.

FIG. 1 schematically illustrates the spectrum of a white LED that is produced by a conventional blue LED and a $Ce:Y_3Al_2O_{12}$ phosphor. As shown in FIG. 1, the high-brightness blue LED with a peak wavelength in the range between 445 and 450 nm is used to excite the $Ce:Y_3Al_2O_{12}$ phosphor. Since the blue color and the yellow color are two complementary colors, the blue light and the yellow light may be mixed to produce the high-brightness white color. In other words, the conventional blue LED and the $Ce:Y_3Al_2O_{12}$ phosphor may be combined as a white LED.

Besides, an ultraviolet (UV) LED with a peak wavelength in the range between 350 and 430 nm may be used to excite red, green and blue (RGB) phosphors. Consequently, the UV light and the RGB light are mixed to produce the white color.

SUMMARY OF THE INVENTION

An embodiment of the present invention provides a white LED chip. The white LED chip includes a P-type layer, a tunneling structure, an N-type layer, an N-type electrode, and a P-type electrode. The tunneling structure is disposed over the P-type layer. The tunneling structure includes a first barrier layer, an active layer and a second barrier layer. The first barrier layer includes a first material layer, the active layer includes a second material layer, and the second barrier layer includes a third material layer. The N-type layer is disposed over the tunneling structure. The N-type electrode is in contact with the N-type layer. The P-type electrode is in contact with the P-type layer. An energy gap of the second material layer is lower than an energy gap of the first material layer and an energy gap of the third material layer. Each of the first material layer, the second material layer and the third material layer is a metal oxide layer, a metal nitride layer or a metal oxynitride layer.

Another embodiment of the present invention provides a white LED packaging device. The white LED packaging device includes a white LED chip and a flip chip package structure. The white LED chip includes a P-type layer, a tunneling structure, an N-type layer, an N-type electrode, and a P-type electrode. The tunneling structure is disposed over the P-type layer. The tunneling structure includes a first barrier layer, an active layer and a second barrier layer. The first barrier layer includes a first material layer, the active layer includes a second material layer, and the second barrier layer includes a third material layer. The N-type layer is disposed over the tunneling structure. The N-type electrode is in contact with the N-type layer. The P-type electrode is in contact with the P-type layer. The flip chip package structure includes a submount, a first bonding pad and a second bonding pad. The first bonding pad is electrically connected with the P-type electrode. The second bonding pad is electrically connected with the N-type electrode. An energy gap of the second material layer is lower than an energy gap of the first material layer and an energy gap of the third material layer. Each of the first material layer, the second material layer and the third material layer is a metal oxide layer, a metal nitride layer or a metal oxynitride layer.

A further embodiment of the present invention provides a white LED chip. The white LED chip includes a P-type layer, a tunneling structure, an N-type layer, an N-type electrode, and a P-type electrode. The tunneling structure is disposed over the P-type layer, wherein the tunneling structure includes plural material layers. The N-type layer is disposed over the tunneling structure. The N-type electrode is in contact with the N-type layer. The P-type electrode is in contact with the P-type layer. A first material layer of the plural material layers is a metal oxide layer, a metal nitride layer or a metal oxynitride layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a novel white LED. The white LED does not contain any phosphor, but is capable of emitting a white light. Moreover, by changing the material of a tunneling structure of the white LED, the peak wavelength of the white light is adjustable. Consequently, the white LED can be controlled to emit a cool white light or a warm white light.

Figure 2:
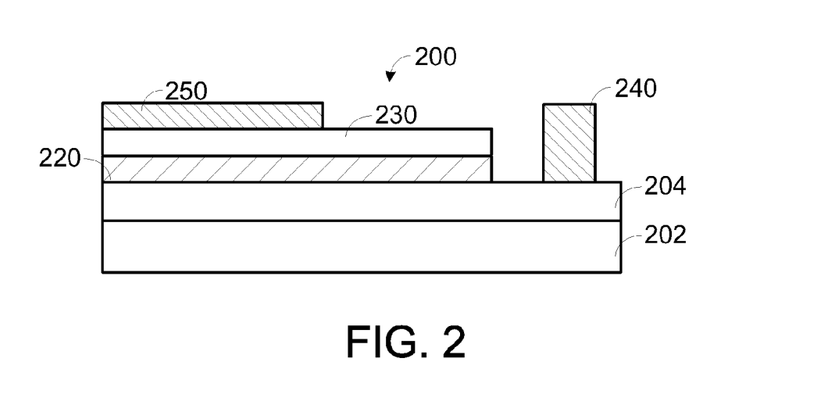
FIG. 2 is a schematic cross-sectional view illustrating a white LED chip according to an embodiment of the present invention.

FIG. 2 is a schematic cross-sectional view illustrating a white LED chip according to an embodiment of the present invention. As shown in FIG. 2, the white LED chip 200 comprises a substrate 202, a P-type layer 204, a tunneling structure 220, an N-type layer 230, a P-type electrode 240, and an N-type electrode 250. The P-type layer 204 is formed on a first surface of the substrate 202. In an embodiment, the substrate 202 is a transparent substrate such as an indium tin oxide (ITO) substrate, and the N-type layer 230 is an N-type ITO layer.

Figure 3A:
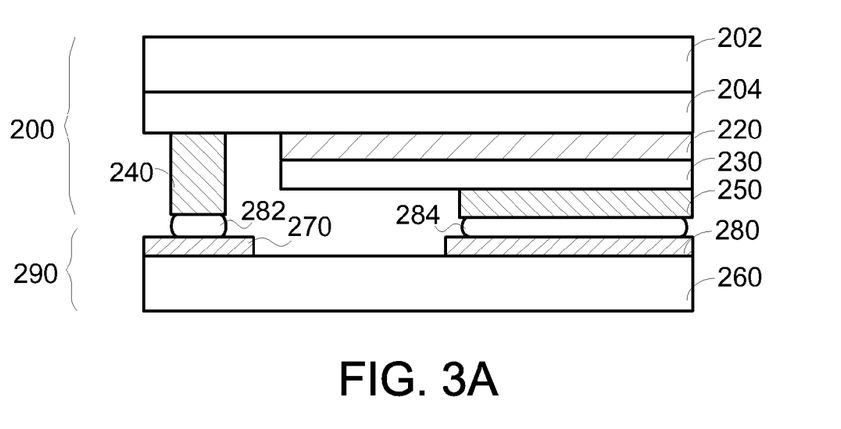
FIG. 3A is a schematic cross-sectional view illustrating a packaging device of a white LED fabricated by a flip chip packaging method according to an embodiment.

FIG. 3A is a schematic cross-sectional view illustrating a white LED packaging device fabricated by a flip chip packaging method according to an embodiment. The white LED packaging device comprises a white LED 200 and a flip chip package structure 290. The structure of the white LED 200 is similar to that of FIG. 2, and is not redundantly described herein. The flip chip package structure 290 comprises a submount 260, a first bonding pad 270 and a second bonding pad 280.

Please refer to FIG. 3A. A first conductive bonding layer 282 is electrically connected between the P-type electrode 240 and the first bonding pad 270. A second conductive bonding layer 284 is electrically connected between the N-type electrode 250 and the second bonding pad 280.

Figure 3B:
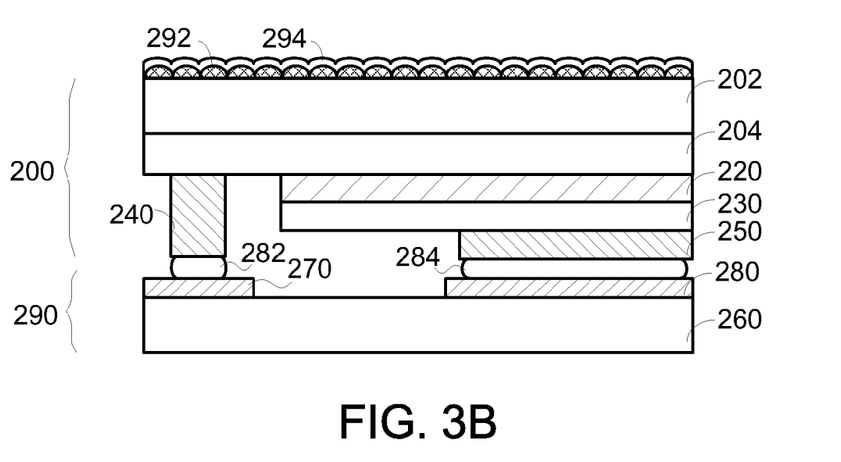
FIG. 3B is a schematic cross-sectional view illustrating a white LED packaging device fabricated by a flip chip packaging method according to another embodiment.

FIG. 3B is a schematic cross-sectional view illustrating a white LED packaging device fabricated by a flip chip packaging method according to another embodiment. The white LED packaging device comprises a white LED 200, a flip chip package structure 290, a nipple lens array 292, and a passivation layer 294. The white LED 200 and the flip chip package structure 290 are similar to those of FIG. 3A, and are not redundantly described herein. The nipple lens array 292 is formed on a second surface of the substrate 202. The passivation layer 294 is formed over the nipple lens array 292. The light beams emitted from the white LED 200 are converged by the nipple lens array 292. In an embodiment, the nipple lens array 292 and the passivation layer 294 are made of silicon dioxide ($SiO_2$).

The materials of the P-type layer 204 and the tunneling structure 220 will be illustrated in more details as follows. The P-type layer 204 may be made of a wide bandgap material or a narrow bandgap material.

For example, the narrow bandgap material is silicon (Si). In case that the P-type layer 204 is made of the narrow bandgap material, the thickness of the P-type layer 204 should be taken into consideration because the narrow bandgap material may absorb the visible light. Generally, if the narrow bandgap material is an indirect bandgap material, the thickness of the P-type layer 204 is smaller than 50 nm. Whereas, if the narrow bandgap material is a direct bandgap material, the thickness of the P-type layer 204 is smaller than 30 nm.

For example, the wide bandgap material is gallium nitride (GaN) or indium gallium nitride (InGaN). In case that the P-type layer 204 is made of the wide bandgap material, the thickness of the P-type layer 204 is not taken into consideration because the wide bandgap material does not absorb the visible light.

The tunneling structure 220 is a stack structure comprising plural material layers. Each of the material layers is a metal oxide layer, a metal nitride layer or a metal oxynitride layer. Hereinafter, various exemplary tunneling structures will be illustrated. The other structures of the white LED packaging device will not be redundantly described herein.

Figure 4A:
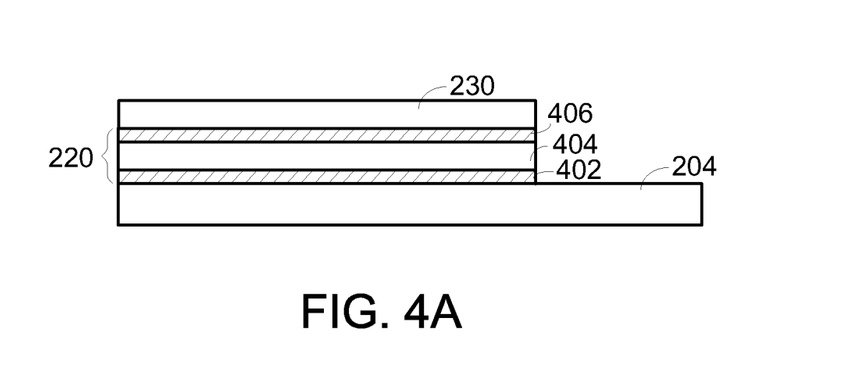
FIGS. 4A, 4B and 4C are schematic cross-sectional views illustrating various exemplary tunneling structures.

FIG. 4A is a schematic cross-sectional view illustrating a first exemplary tunneling structure. The tunneling structure 220 is arranged between the P-type layer 204 and N-type layer 230. In this embodiment, the tunneling structure 220 is a stack structure comprising a first material layer 402, a second material layer 404 and a third material layer 406. Moreover, the energy gap of the second material layer 404 is lower than the energy gap of the first material layer 402 and the energy gap of the third material layer 406. In other words, the first material layer 402 and the third material layer 406 are barrier layers, and the second material layer 404 is an active layer or a well region.

In an embodiment, all of the first material layer 402, the second material layer 404 and the third material layer 406 are metal oxide layers. For example, the first material layer 402 and the third material layer 406 are made of hafnium oxide ($HfO_2$), and the second material layer 404 is made of zinc oxide (ZnO).

In case that the P-type layer 204 is a <111> silicon P-type layer, the white LED packaging device may emit a cool white light with a peak wavelength of about 550 nm. Moreover, in case that the P-type layer 204 is a <100> silicon P-type layer, the white LED packaging device may emit a warm white light with a peak wavelength of about 575 nm. In other words, the peak wavelength of the white LED packaging device may be changed according to the structure of the P-type layer 204.

Alternatively, in another embodiment, all of the first material layer 402, the second material layer 404 and the third material layer 406 are metal nitride layers. For example, the first material layer 402 and the third material layer 406 are made of hafnium nitride (HfN), and the second material layer 404 is made of zinc nitride ($Zn_3N_2$). Under the same condition, the peak wavelength of the white light emitted by the white LED packaging device with the tunneling structure 220 formed by the metal nitride layers are longer than the peak wavelength of the white light emitted by the white LED packaging device with the tunneling structure 220 formed by the metal oxide layers.

Alternatively, in another embodiment, the first material layer 402, the second material layer 404 and the third material layer 406 are the combination of metal oxide layers and metal nitride layers. For example, the first material layer 402 and the third material layer 406 are made of hafnium oxide ($HfO_2$), and the second material layer 404 is made of zinc nitride ($Zn_3N_2$).

As mentioned above, the second material layer 404 may be formed by a metal oxide layer or a metal nitride layer. In addition, the second material layer 404 may be formed by a metal oxynitride layer. For example, the second material layer 404 is made of zinc oxynitride (ZnON). In other words, the peak wavelength of the white light emitted by the white LED packaging device may be changed by adjusting the ingredient of the second material layer 404.

Figure 4B:
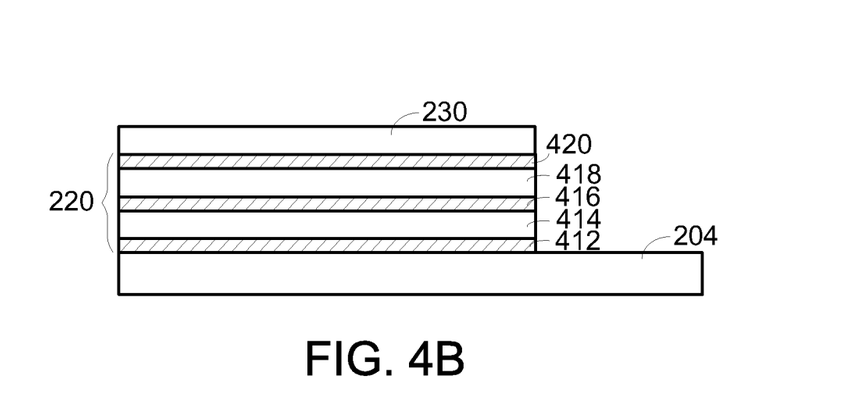

FIG. 4B is a schematic cross-sectional view illustrating a second exemplary tunneling structure. The tunneling structure 220 is arranged between the P-type layer 204 and N-type layer 230. In this embodiment, the tunneling structure 220 is a stack structure comprising a first material layer 412, a second material layer 414, a third material layer 416, a fourth material layer 418 and a fifth material layer 420. Moreover, the energy gap of the second material layer 414 and the energy gap of the fourth material layer 418 are lower than the energy gap of the first material layer 412, the energy gap of the third material layer 416 and the energy gap of the fifth material layer 420. In other words, the first material layer 412, the third material layer 416 and the fifth material layer 420 are barrier layers, and the second material layer 414 and the fourth material layer 418 are active layers or well regions.

In an embodiment, all of the first material layer 412, the second material layer 414, the third material layer 416, the fourth material layer 418 and the fifth material layer 420 are metal oxide layers. For example, the first material layer 412, the third material layer 416 and the fifth material layer 420 are made of hafnium oxide ($HfO_2$), and the second material layer 414 and the fourth material layer 418 are made of zinc oxide (ZnO).

In case that the P-type layer 204 is a <111> silicon P-type layer, the white LED packaging device may emit a white light with a peak wavelength of about 580 nm. Moreover, in case that the P-type layer 204 is a <100> silicon P-type layer, the white LED packaging device may emit a white light with a peak wavelength of about 610 nm.

Alternatively, in another embodiment, all of the first material layer 412, the second material layer 414, the third material layer 416, the fourth material layer 418 and the fifth material layer 420 are metal nitride layers. For example, the first material layer 412, the third material layer 416 and the fifth material layer 420 are made of hafnium nitride (HfN), and the second material layer 414 and the fourth material layer 418 are made of zinc nitride ($Zn_3N_2$).

Alternatively, in another embodiment, the first material layer 412, the second material layer 414, the third material layer 416, the fourth material layer 418 and the fifth material layer 420 are the combination of metal oxide layers and metal nitride layers. For example, the first material layer 412, the third material layer 416 and the fifth material layer 420 are made of hafnium oxide ($HfO_2$), the second material layer 414 is made of zinc oxide (ZnO), and the fourth material layer 418 is made of zinc nitride ($Zn_3N_2$).

As mentioned above, the second material layer 414 may be formed by a metal oxide layer or a metal nitride layer. In addition, the second material layer 414 may be formed by a metal oxynitride layer. For example, the second material layer 404 is made of zinc oxynitride (ZnON).

Figure 4C:
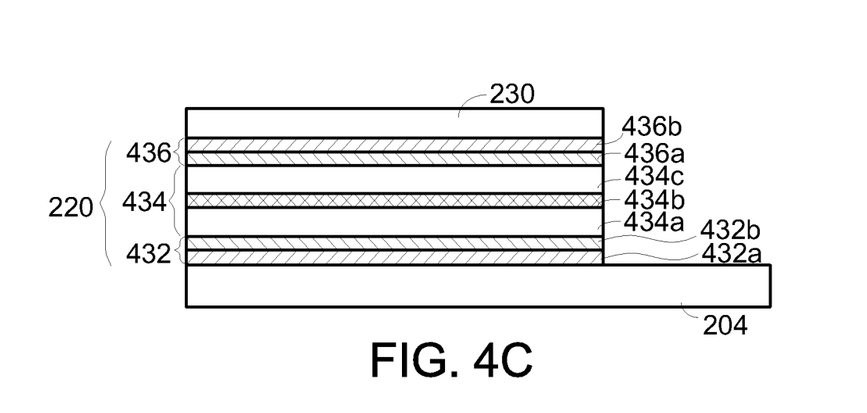

FIG. 4C is a schematic cross-sectional view illustrating a third exemplary tunneling structure. The tunneling structure 220 is arranged between the P-type layer 204 and N-type layer 230. In this embodiment, the tunneling structure 220 is a stack structure comprising a first barrier layer 432, an active layer 434 and a second barrier layer 436. Moreover, the energy gap of the active layer 434 is lower than the energy gap of the first barrier layer 432 and the energy gap of the second barrier layer 436.

Moreover, each of the first barrier layer 432, the active layer 434 and the second barrier layer 436 is composed of different material layers. For example, the first barrier layer 432 comprises two material layers 432a and 432b, wherein the material layer 432a is made of hafnium oxide ($HfO_2$) and the material layer 432b is made of hafnium nitride (HfN). The second barrier layer 436 comprises two material layers 436a and 436b, wherein the material layer 436a is made of hafnium oxide ($HfO_2$) and the material layer 436b is made of hafnium nitride (HfN). The active layer 434 comprises three material layers 434a, 434b and 434c, wherein the material layer 434a is made of zinc oxide (ZnO), the material layer 434b is made of zinc nitride ($Zn_3N_2$) and the material layer 434c is made of zinc oxide (ZnO).

It is noted that the materials of the barrier layers are not restricted to the above materials with the high energy gap. For example, the barrier layers may be made of hafnium oxide ($HfO_2$), hafnium nitride (HfN), hafnium oxynitride (HfON), aluminum oxide ($Al_2O_3$), aluminum nitride (AlN), aluminum oxynitride (AlON), gallium oxide ($Ga_2O_3$), gallium nitride (GaN) or gallium oxynitride (GaON).

It is noted that the materials of the active layer are not restricted to the above materials with the low energy gap. For example, the active layer may be made of zinc oxide (ZnO), zinc nitride ($Zn_3N_2$), zinc oxynitride (ZnON), indium oxide ($In_2O_3$), indium nitride (InN), indium oxynitride (InON), indium gallium oxide (InGaO), indium gallium nitride (InGaN) or indium gallium oxynitride (InGaON).

As mentioned above, the peak wavelength of the white LED packaging device may be adjusted according to the material layers of the tunneling structure 220. Moreover, the peak wavelength of the white LED packaging device may be adjusted according to the process conditions of the white LED packaging device.

Figure 5:
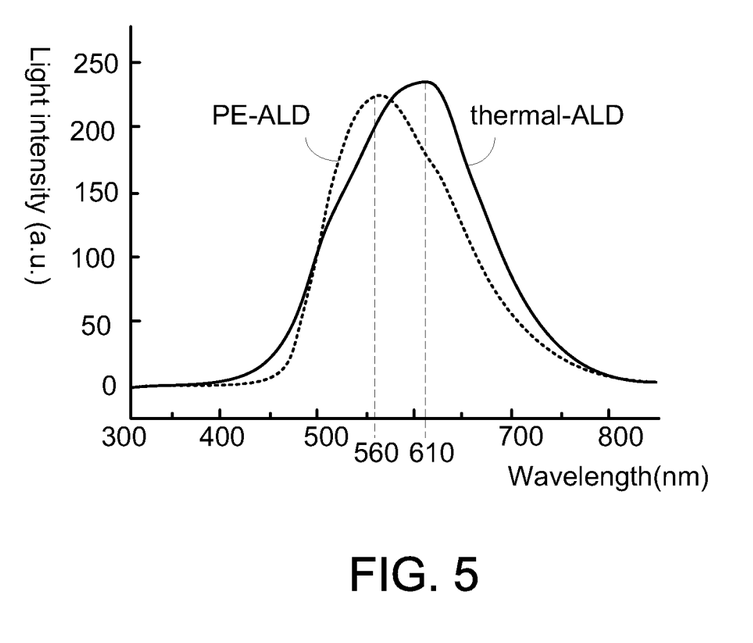
FIG. 5 schematically illustrates a spectrum of the white LED packaging devices according different process conditions.

FIG. 5 schematically illustrates a spectrum of the white LED packaging devices according different process conditions. In case that the P-type layer 204 is a <100> silicon P-type layer, the tunneling structure 220 overlying the P-type layer is a stack structure comprising a hafnium oxide ($HfO_2$) material layer (2 nm), a zinc oxide (ZnO) material layer (6 nm) and a hafnium oxide ($HfO_2$) material layer (2 nm).

If the three material layers of the tunneling structure 220 are fabricated by a plasma-enhanced atomic layer deposition (PE-ALD) process, the white LED packaging device may emit a white light with a peak wavelength of about 560 nm. Whereas, if the three material layers of the tunneling structure 220 are fabricated by a thermal atomic layer deposition (thermal-ALD) process, the white LED packaging device may emit a white light with a peak wavelength of about 610 nm. In other words, when the process condition of the white LED packaging device is changed, the peak wavelength of the white LED packaging device is correspondingly changed.

Moreover, the P-type layer 204 is a P-type silicon layer, but is not limited thereto. Of course, the P-type layer 204 may be a P-type gallium nitride (P-GaN) layer, a P-type gallium arsenide (P-GaAs) layer or a P-type silicon carbide (P-SiC) layer.

From the above descriptions, the present invention a novel white LED chip and a novel white LED packaging device. The tunneling structure is a stack structure comprising metal oxide layers, metal nitride layers and/or metal oxynitride layers. Consequently, a white light is emitted from the active layer, and the peak wavelength is adjustable. Moreover, the white LED may be further packaged into a finished white LED packaging device by any appropriate packaging method (e.g. a flip chip packaging method).

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A white light emitting diode (LED) chip, comprising:
   a P-type layer;
   a tunneling structure disposed over the P-type layer, wherein the tunneling structure comprises a first barrier layer, an active layer and a second barrier layer, wherein a white light is emitted from the active layer, the first barrier is disposed over the P-type layer, the active layer is disposed over the first barrier layer, the second barrier layer is disposed over the active layer, the first barrier layer comprises a first material layer, the active layer comprises a second material layer, and the second barrier layer comprises a third material layer;
   an N-type layer disposed over the tunneling structure;
   an N-type electrode in contact with the N-type layer; and
   a P-type electrode in contact with the P-type layer;
   wherein an energy gap of the second material layer is lower than an energy gap of the first material layer and an energy gap of the third material layer;
   wherein each of the first material layer and the third material layer is one of a gallium oxide layer, a hafnium oxide layer, a hafnium nitride layer, and a first metal oxynitride layer;
   wherein the second material layer is one of an indium gallium oxide layer, a zinc nitride layer, and a second metal oxynitride layer; and
   wherein said first metal oxynitride layer is a hafnium oxynitride layer or an aluminum oxynitride layer.

2. The white LED chip as claimed in claim 1, wherein said second metal oxynitride layer is a zinc oxynitride layer, an indium oxynitride layer, or an indium gallium oxynitride layer.

3. The white LED chip as claimed in claim 1, further comprises a substrate, wherein the substrate is in contact with the P-type layer.

4. The white LED chip as claimed in claim 3, wherein the substrate is an indium tin oxide substrate.

5. The white LED chip as claimed in claim 1, wherein the tunneling structure is a stack structure comprising the first material layer, the second material layer, the third material layer, a fourth material layer disposed over the third material layer and a fifth material layer disposed over the fourth material layer, wherein the energy gap of the second material layer is lower than the energy gap of the first material layer and the energy gap of the third material layer, and an energy gap of the fourth material layer is lower than the energy gap of the third material layer and an energy gap of the fifth material layer.

6. The white LED chip as claimed in claim 1, wherein the P-type layer is a P-type silicon layer, a P-type gallium nitride layer, a P-type gallium arsenide layer or a P-type silicon carbide layer.

7. A white light emitting diode (LED) packaging device, comprising:
   a white LED chip comprising:
      a substrate;
      a P-type layer formed on a first surface of the substrate;
      a tunneling structure disposed over the P-type layer, wherein the tunneling structure comprises a first barrier layer, an active layer and a second barrier layer, wherein a white light is emitted from the active layer, the first barrier is disposed over the P-type layer, the active layer is disposed over the first barrier layer, the second barrier layer is disposed over the active layer, the first barrier layer comprises a first material layer, the active layer comprises a second material layer, and the second barrier layer comprises a third material layer;
      an N-type layer disposed over the tunneling structure;
      an N-type electrode in contact with the N-type layer; and
      a P-type electrode in contact with the P-type layer, and
   a flip chip package structure comprising:
      a submount;
      a first bonding pad electrically connected with the P-type electrode; and
      a second bonding pad electrically connected with the N-type electrode;
   wherein an energy gap of the second material layer is lower than an energy gap of the first material layer and an energy gap of the third material layer;
   wherein each of the first material layer and the third material layer is one of a gallium oxide layer, a hafnium oxide layer, a hafnium nitride layer, and a first metal oxynitride layer;
   wherein the second material layer is one of an indium gallium oxide layer, a zinc nitride layer, and a second metal oxynitride layer;
   wherein said first metal oxynitride layer is a hafnium oxynitride layer or an aluminum oxynitride layer; and
   wherein said second metal oxynitride layer is an indium oxynitride layer or an indium gallium oxynitride layer.

8. The white LED packaging device as claimed in claim 7, wherein the substrate is an indium tin oxide substrate.

9. The white LED packaging device as claimed in claim 7, further comprising:
   a nipple lens array formed on a second surface of the substrate; and
   a passivation layer formed over the nipple lens array.

10. The white LED packaging device as claimed in claim 7, wherein the tunneling structure is a stack structure comprising the first material layer, the second material layer, the third material layer, a fourth material layer disposed over the third material layer and a fifth material layer disposed over the fourth material layer, wherein the energy gap of the second material layer is lower than the energy gap of the first material layer and the energy gap of the third material layer, and an energy gap of the fourth material layer is lower than the energy gap of the third material layer and an energy gap of the fifth material layer.

11. The white LED packaging device as claimed in claim 7, wherein the P-type layer is a P-type silicon layer, a P-type gallium nitride layer, a P-type gallium arsenide layer or a P-type silicon carbide layer.

12. A white light emitting diode (LED) chip, comprising:
   a P-type layer;
   a tunneling structure disposed over the P-type layer, wherein the tunneling structure comprises plural material layers including a first material layer and a second material layer;
   an N-type layer disposed over the tunneling structure;
   an N-type electrode in contact with the N-type layer; and
   a P-type electrode in contact with the P-type layer;
   wherein said first material layer is one of a gallium oxide layer, a hafnium oxide layer, a hafnium nitride layer, and a first metal oxynitride layer;
   wherein said second material layer is one of an indium gallium oxide layer, a zinc nitride layer, and a second metal oxynitride layer; and
   wherein said second metal oxynitride layer is an indium oxynitride layer or an indium gallium oxynitride layer.

13. The white LED chip as claimed in claim 12, wherein said first layer of the plural material layers is a barrier layer, and the barrier layer is a hafnium oxynitride layer, an aluminum oxynitride layer, or a gallium oxynitride layer.

14. The white LED chip as claimed in claim 12, further comprises a substrate, wherein the substrate is in contact with the P-type layer.

15. The white LED chip as claimed in claim 14, wherein the substrate is an indium tin oxide substrate.

16. The white LED chip as claimed in claim 12, wherein the P-type layer is a P-type silicon layer, a P-type gallium nitride layer, a P-type gallium arsenide layer or a P-type silicon carbide layer.

* * * * *